(12) United States Patent
Shim et al.

(10) Patent No.: US 7,405,437 B2
(45) Date of Patent: Jul. 29, 2008

(54) CMOS IMAGE SENSOR AND METHOD FOR FABRICATING THE SAME

(75) Inventors: Hee Sung Shim, Seoul (KR); Tae Woo Kim, Icheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 86 days.

(21) Appl. No.: 11/318,577

(22) Filed: Dec. 28, 2005

(65) Prior Publication Data

US 2006/0138493 A1 Jun. 29, 2006

(30) Foreign Application Priority Data

Dec. 29, 2004 (KR) .................. 10-2004-0114785

(51) Int. Cl.
*H01L 31/062* (2006.01)
*H01L 31/113* (2006.01)

(52) U.S. Cl. .............. 257/292; 257/291; 257/293; 257/332

(58) Field of Classification Search ............ 257/72, 257/291–298, 320, 331, 332, 338, 350, 351, 257/357, 369, 371; 438/29, 57, 60, 69, 70, 438/73, 75, 48, 224, 286
See application file for complete search history.

(56) References Cited

U.S. PATENT DOCUMENTS

| | | | | |
|---|---|---|---|---|
| 5,926,693 A * | 7/1999 | Gardner et al. | .................. | 438/67 |
| 6,037,629 A * | 3/2000 | Gardner et al. | ................ | 257/333 |
| 6,504,193 B1 * | 1/2003 | Ishiwata et al. | ............. | 257/291 |
| 6,838,298 B2 * | 1/2005 | Lee | ............... | 438/29 |
| 6,897,082 B2 * | 5/2005 | Rhodes et al. | ................ | 438/48 |
| 7,187,018 B2 * | 3/2007 | Mouli et al. | ................ | 257/222 |
| 2003/0173603 A1 * | 9/2003 | Shim | .......................... | 257/292 |
| 2003/0228736 A1 * | 12/2003 | Kimura | ...................... | 438/286 |
| 2004/0092054 A1 * | 5/2004 | Mouli et al. | ................... | 438/60 |
| 2004/0262609 A1 * | 12/2004 | Mouli et al. | ................... | 257/72 |
| 2005/0179059 A1 * | 8/2005 | Rhodes et al. | ............... | 257/204 |

FOREIGN PATENT DOCUMENTS

| KR | 10-2003-0000654 | 1/2003 |
|---|---|---|
| KR | 2003-0000654 A | 1/2003 |

* cited by examiner

*Primary Examiner*—Zandra Smith
*Assistant Examiner*—Telly D Green
(74) *Attorney, Agent, or Firm*—McKenna Long & Aldridge LLP

(57) ABSTRACT

A CMOS image sensor includes a first conductive type semiconductor substrate defined by a photodiode area and a transistor area, a trench formed in the semiconductor substrate corresponding to a transfer transistor of the transistor area, a gate electrode of the transfer transistor, formed in the trench, a second conductive type impurity ion area formed in the semiconductor substrate of the photodiode area, and a first conductive type impurity ion area formed on a surface of the second conductive type impurity ion area.

8 Claims, 15 Drawing Sheets

CMOS IMAGE SENSOR AND METHOD FOR FABRICATING THE SAME

CROSS-REFERENCE TO RELATED APPLICATION

This application claims the benefit of Korean Patent Application No. P2004-114785, filed on Dec. 29, 2004, which is hereby incorporated by reference as if fully set forth herein.

BACKGROUND OF THE INVENTION

1. Field of the Invention

The present invention relates to a complementary metal-oxide semiconductor (CMOS) image sensor and a method for fabricating the same, and more particularly, to a CMOS image sensor and a method for fabricating the same in which a dead zone and a dark current are simultaneously reduced.

2. Discussion of the Related Art

Generally, an image sensor is a semiconductor device that converts optical images to electrical signals. The image sensor is classified into a charge coupled device (CCD) or a CMOS image sensor.

The CCD has drawbacks in its fabricating process as a result of a complicated driving mode, high power consumption, and multistage photolithographic processes. Also, it is difficult for a control circuit, a signal processing circuit, and an analog-to-digital converter to integrate in a chip of the CCD. This results in a difficulty in obtaining a slim sized product.

Recently, the CMOS image sensor has been proposed to overcome the drawbacks of the CCD.

The CMOS image sensor employs a switching mode that sequentially detects outputs of unit pixels using MOS transistors corresponding to the number of the unit pixels on a semiconductor substrate using the CMOS technology that uses a control circuit and a signal processing circuit as peripheral circuits.

The CMOS image sensor has advantages in that power consumption is low because of CMOS technology, and the fabricating process is simple because of a relatively small number of photolithographic process steps. Further, since the CMOS image sensor allows a control circuit, a signal processing circuit, and an analog-to-digital converter to be integrated in its chip, it has an advantage in that a slim sized product can be obtained. Therefore, the CMOS image sensor is widely used for various application fields, such as digital photo camera and digital video camera.

A general CMOS image sensor will be described with reference to FIGS. 1 and 2. FIG. 1 is a layout illustrating a unit pixel of a 4T type CMOS image sensor having four transistors, and FIG. 2 is an equivalent circuit diagram illustrating the unit pixel of the CMOS image sensor shown in FIG. 1.

In the unit pixel of the 4T type CMOS image sensor, as shown in FIGS. 1 and 2, a photodiode 20 is formed in a wide portion of an active area 10, and gate electrodes 110, 120, 130, and 140 of four transistors are formed to respectively overlap the other portions of the active area 10. In other words, a transfer transistor Tx, a reset transistor Rx, a drive transistor Dx and a selection transistor Sx are respectively formed by the gate electrodes 110, 120, 130 and 140.

Impurity ions are implanted into the active area 10 of each transistor, except portions below the gate electrodes 110, 120, 130 and 140, so that source and drain areas of each transistor are formed. Thus, a power voltage Vdd is applied to the source and drain areas between the reset transistor Rx and the drive transistor Dx, and a power voltage Vss is applied to the source and drain areas at one side of the selection transistor Sx.

The transfer transistor Tx transfers optical charges generated by the photodiode to a floating diffusion (FD) layer. The reset transistor Rx controls and resets the potential of the floating diffusion layer. The drive transistor Dx serves as a source follower. The selection transistor Sx serves as a switching transistor to read a signal of the unit pixel.

A method for fabricating the aforementioned related art CMOS image sensor will be described with reference to FIG. 3A to FIG. 3G. FIG. 3A to FIG. 3G are sectional views taken along line I-I of the unit pixel of the CMOS image sensor shown in FIG. 1.

First, as shown in FIG. 3A, a lightly doped P type (P-) epitaxial layer 2 is formed on a P type semiconductor substrate 1 defined by an active area and a device isolation area using a mask. Then, the lightly doped P type epitaxial layer 2 is etched at a predetermined depth by exposing and developing processes using the mask to form a trench. An oxide film is formed on the epitaxial layer 2. The trench is filled with the oxide film by a chemical mechanical polishing (CMP) process so as to form a device isolation film 3 in the device isolation area.

Impurity ions are implanted into the surface of the epitaxial layer 2 corresponding to the active area to form a P type layer 2 impurity ion area 4. The P type impurity ion area 4 is used to control a threshold voltage in a channel area of the transfer transistor and to pin a surface voltage in the photodiode.

As shown in FIG. 3B, a gate insulating film and a conductive layer are sequentially formed on the entire surface of the substrate and then selectively dry-etched to form a gate insulating film 5 and a gate electrode 6 of the transistors, including the transfer transistor.

As shown in FIG. 3C, a photoresist film is coated on the entire surface and then removed by exposing and developing processes to form a photoresist pattern 7 that exposes the photodiode. In other words, the photoresist pattern 7 is formed to partially cover the active area adjacent to the device isolation film 3 and partially expose the gate electrode 6. N type impurity ions are implanted into the epitaxial layer 2 of the exposed photodiode by high energy ion implantation to form an N type impurity ion area 8 of the photodiode. The photoresist pattern 7 is then removed.

As shown in FIG. 3D, when the N type impurity ion area 8 is formed, a photoresist pattern 9 is formed to expose the photodiode. Afterwards, P type impurity ions are implanted into the surface of the N type impurity ion area 8 to form a second P type impurity ion area 10 of the photodiode. The second P type impurity ion area 10 may be formed as follows.

As shown in FIG. 3E, when the N type impurity ion area 8 is formed, an insulating film is deposited on the entire surface and then etched back to form insulating film spacers 11 at sides of the gate electrode 6 and the photoresist pattern 9 that exposes the photodiode. Then, P type impurity ions are implanted into the surface of the N type impurity ion area 8 to form the second P type impurity ion area 10.

As shown in FIG. 3F, after the photoresist pattern 9 is removed, a source and drain area (floating diffusion layer) 12 of each transistor is formed by heavily implanting N type impurity ions into the drain area at one side of the gate electrode 6 using a mask, Afterwards, although not shown, color filter layers and microlenses are formed. Thus, the CMOS image sensor is completely fabricated.

In the aforementioned conventional CMOS image sensor, the photodiode converts signals of light into electrical signals to generate optical charges. The generated optical charges move to the floating diffusion layer to gate the drive transistor Dx if the transfer transistor Tx is turned on. However, as shown in FIG. 3D, if the P type impurity ions are implanted before the spacers are formed, the epitaxial layer below the spacers is pinned. In this case, dark current characteristics are improved, but the P type impurity ion doping level increases. As the P type impurity ion doping level increases, a potential barrier of the source area of the transfer transistor increases to reduce transfer efficiency of the optical charges. For this reason, a problem occurs in that a dead zone is formed, in which no signal is generated for a certain time period after light enters the sensor.

Furthermore, as shown in FIG. 3F, if the P type impurity ions are implanted after the spacers are formed at the sidewalls of the gate electrode, a transfer efficiency of the optical charges is improved. However, the surface of the photodiode is damaged during the dry-etching process for formation of the spacers, thereby increasing the dark current.

SUMMARY OF THE INVENTION

Accordingly, the present invention is directed to a CMOS image sensor and a method for fabricating the same that substantially obviates one or more problems due to limitations and disadvantages of the related art.

The present invention provides a CMOS image sensor and a method for fabricating the same in which a trench is formed in a surface of an epitaxial layer and a transfer transistor is formed in the trench so as to simultaneously reduce a dead zone and a dark current.

Additional advantages and features of the invention will be set forth in the description which follows and will become apparent to those having ordinary skill in the art upon examination of the following. These and other advantages of the invention may be realized and attained by the structure particularly pointed out in the written description and claims hereof as well as the appended drawings.

To achieve these and other advantages and in accordance with the purpose of the invention, as embodied and broadly described herein, a CMOS image sensor according to the present invention includes a first conductive type semiconductor substrate defined by a photodiode area and a transistor area, a trench formed in the semiconductor substrate corresponding to a transfer transistor of the transistor area, a gate electrode of the transfer transistor, formed in the trench, a second conductive type impurity ion area formed in the semiconductor substrate of the photodiode area, and a first conductive type impurity ion area formed on a surface of the second conductive type impurity ion area.

The CMOS image sensor can further include a plurality of gate electrodes formed on the semiconductor substrate of the transistor area, excluding the transistor area of the transfer transistor, and source and drain impurity ion areas formed in the semiconductor substrate between the respective gate electrodes.

The CMOS image sensor can further include an impurity ion implantation area for controlling a threshold voltage, formed on the semiconductor substrate below the gate electrode of each transistor.

The CMOS image sensor can further include spacers formed at sidewalls of each gate electrode, and the first conductive type impurity ion area extended to a portion below the spacers.

In another aspect of the present invention, a method for fabricating a CMOS image sensor includes forming a first insulating film on an entire surface of a first conductive type semiconductor substrate defined by a photodiode area and a transistor area, selectively removing the first insulating film on the transistor area for a transfer transistor, forming a trench in the semiconductor substrate corresponding to a portion from which the first insulating film is removed, forming an impurity ion implantation area for controlling a threshold voltage of the transfer transistor below the trench, and forming a gate insulating film and a gate electrode of the transfer transistor in the trench.

The method can further include forming an oxide film inside the trench before forming the impurity ion implantation area for controlling the threshold voltage, and removing the oxide film before forming the gate insulating film.

The method can further include depositing a second insulating film on the entire surface of the semiconductor substrate and removing the first and second insulating films on the transistor area excluding the transfer transistor, forming a plurality of gate insulating films and a plurality of gate electrodes on the semiconductor substrate from which the first and second insulating films are removed, and removing all the first and second insulating films.

The method can further include forming an impurity ion implantation area for controlling a threshold voltage on the semiconductor substrate of the transistor area, excluding the transfer transistor before forming the first insulating film, and forming spacers at sidewalls of each gate electrode.

The method can further include forming a second conductive type impurity ion area in the semiconductor substrate of the photodiode area, forming a first conductive type impurity ion area on a surface of the second conductive type impurity ion area, and forming source and drain impurity ion areas in the semiconductor substrate between the respective gate electrodes.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention illustrate exemplary embodiments of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

FIG. 4A to FIG. 4M are sectional views illustrating a CMOS image sensor manufactured according to an exemplary embodiment of the present invention.

Figure 1:
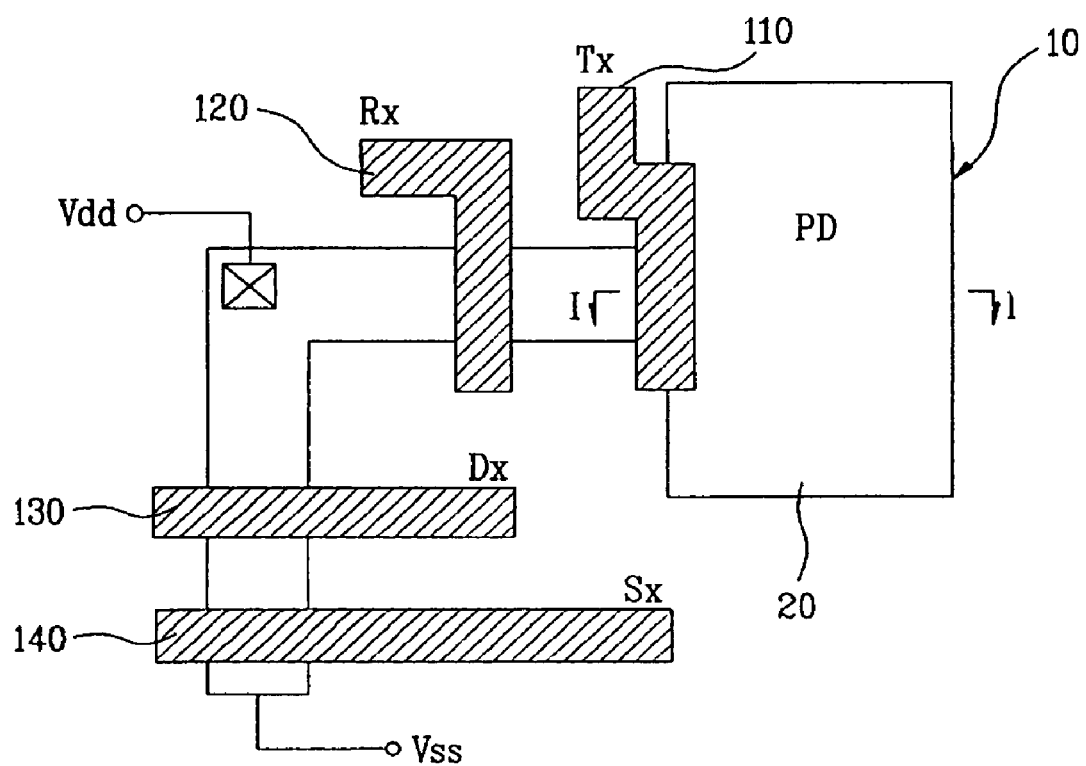
FIG. 1 is a layout illustrating a unit pixel of a 4T type CMOS image sensor including four transistors.
Figure 2:
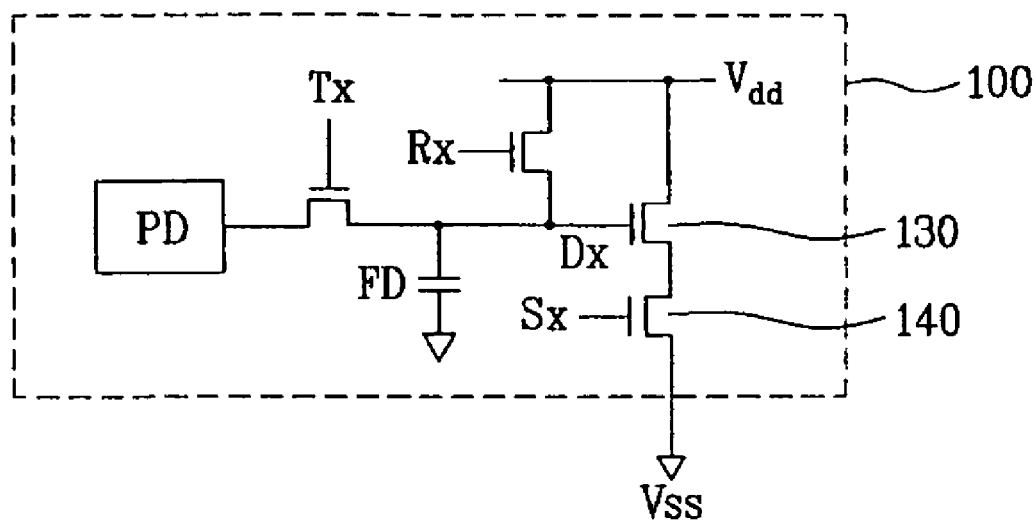
FIG. 2 is an equivalent circuit diagram illustrating the unit pixel of the CMOS image sensor shown in FIG. 1.
Figure 3A:
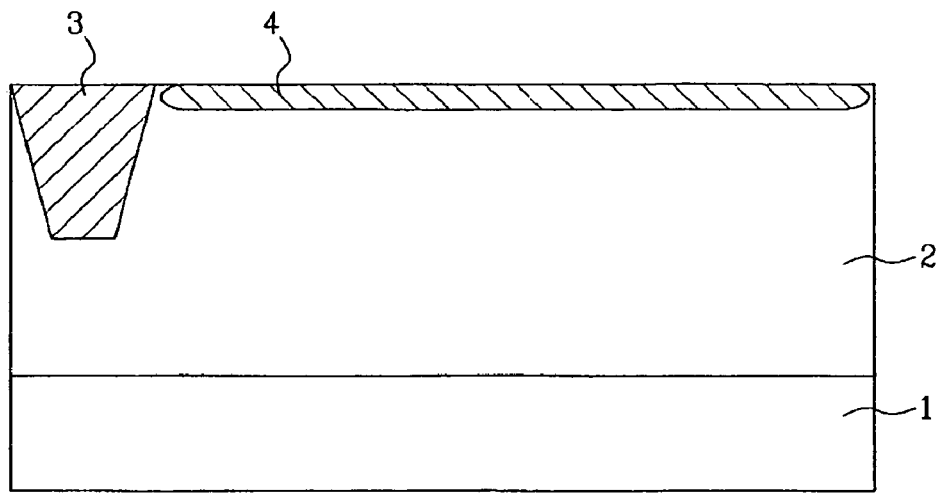
FIG. 3A to FIG. 3F are sectional views illustrating CMOS image sensor fabricated in accordance with the related art.
Figure 3B:
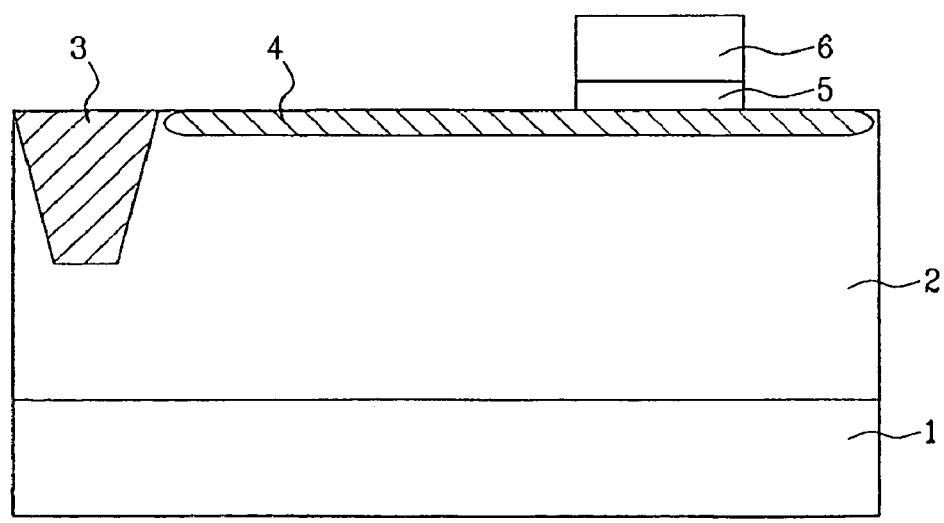
Figure 3C:
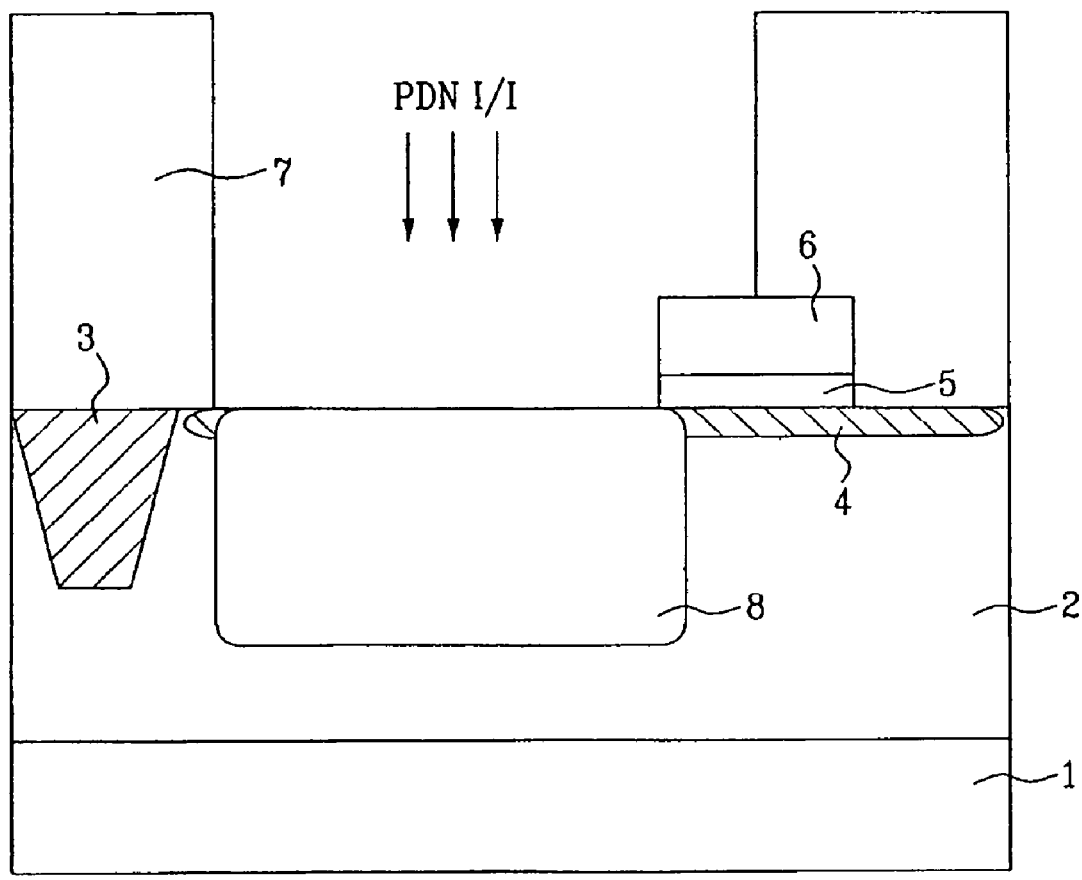
Figure 3D:
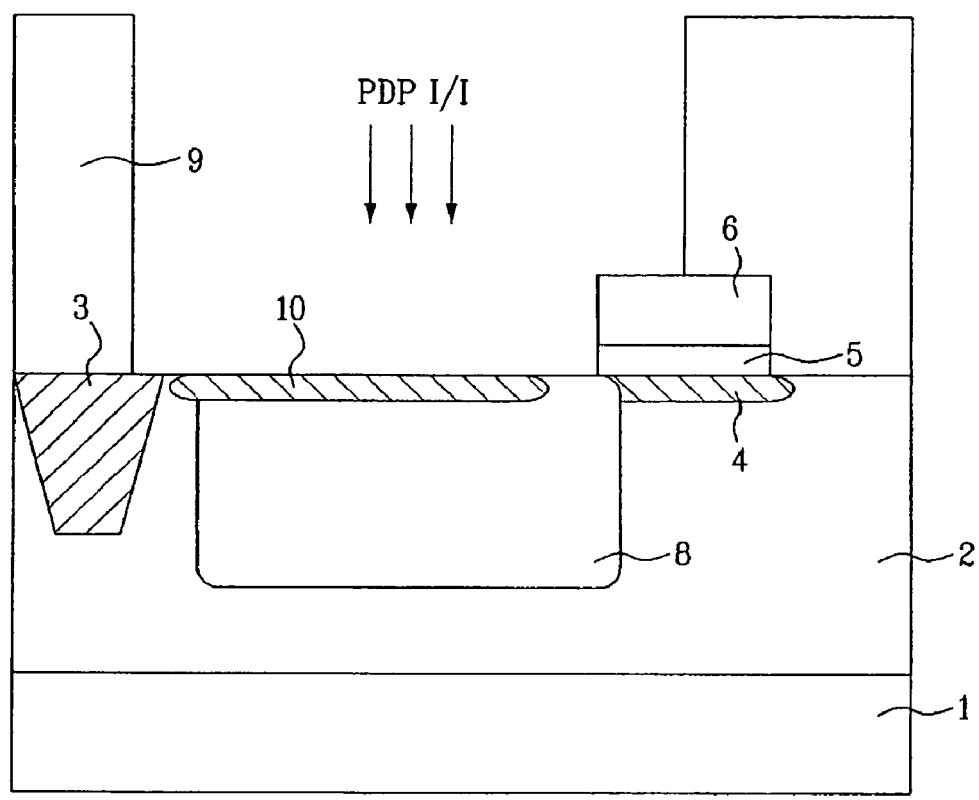
Figure 3E:
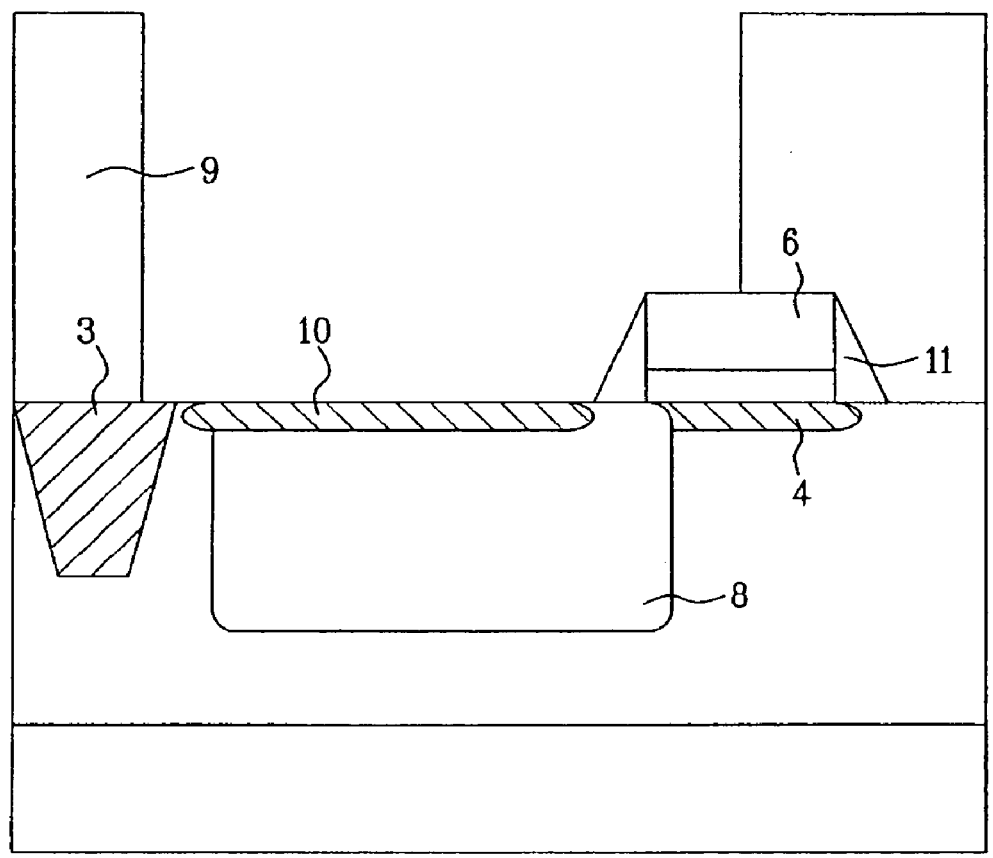
Figure 3F:
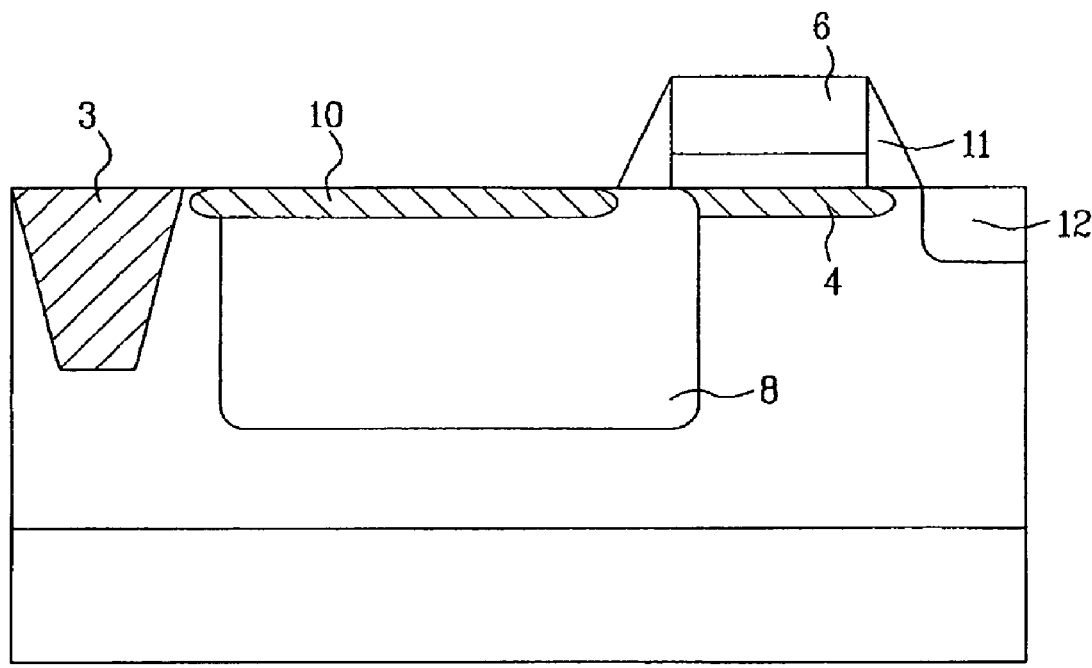
Figure 4A:
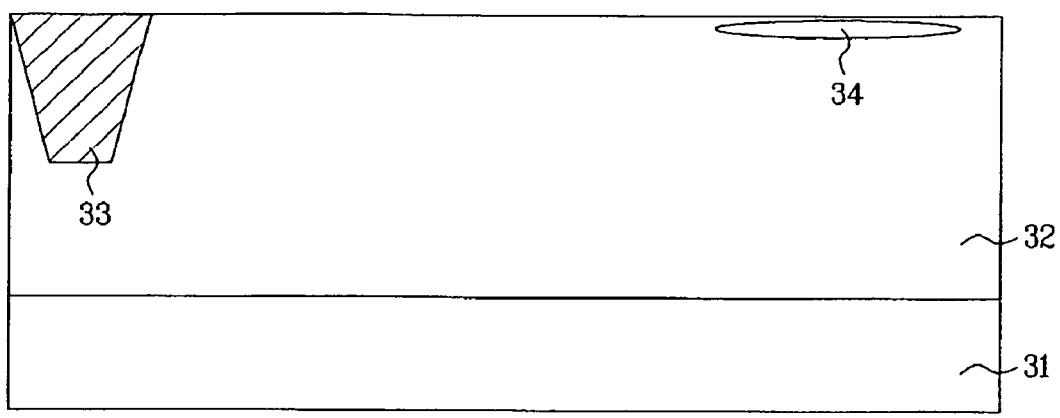
FIG. 4A to FIG. 4M are sectional views illustrating a CMOS image sensor fabricated according to an exemplary embodiment of the present invention.

As shown in FIG. 4A, a lightly doped P type (P-) epitaxial layer 32 is formed on a P type semiconductor substrate 31 defined by an active area and a device isolation area using a mask pattern. Then, the lightly doped P type epitaxial layer 32 of the device isolation area is etched at a predetermined depth using the mask pattern to form a trench. An oxide film is formed on the substrate such that the trench is filled with the oxide film. The oxide film is patterned by a chemical mechanical polishing (CMP) process to remain in the trench, so that a device isolation film 33 is formed in the device isolation area.

An impurity ion area 34 for controlling a threshold voltage is formed in a reset transistor area, excluding a photodiode area and a transfer transistor area from the epitaxial layer 32 of the active area.

Figure 4B:
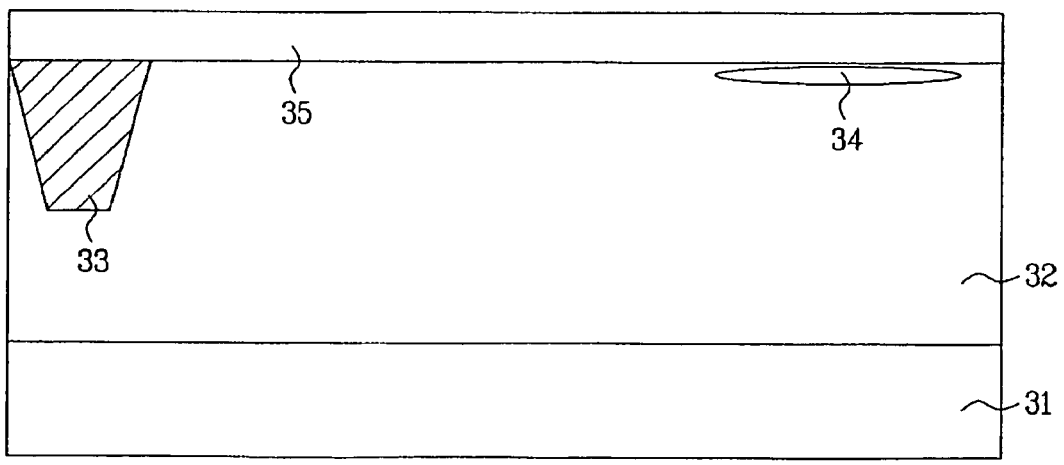

As shown in FIG. 4B, a first gate insulating film 35, such as oxide film or nitride film, is formed on the entire surface of the epitaxial layer 32.

Figure 4C:
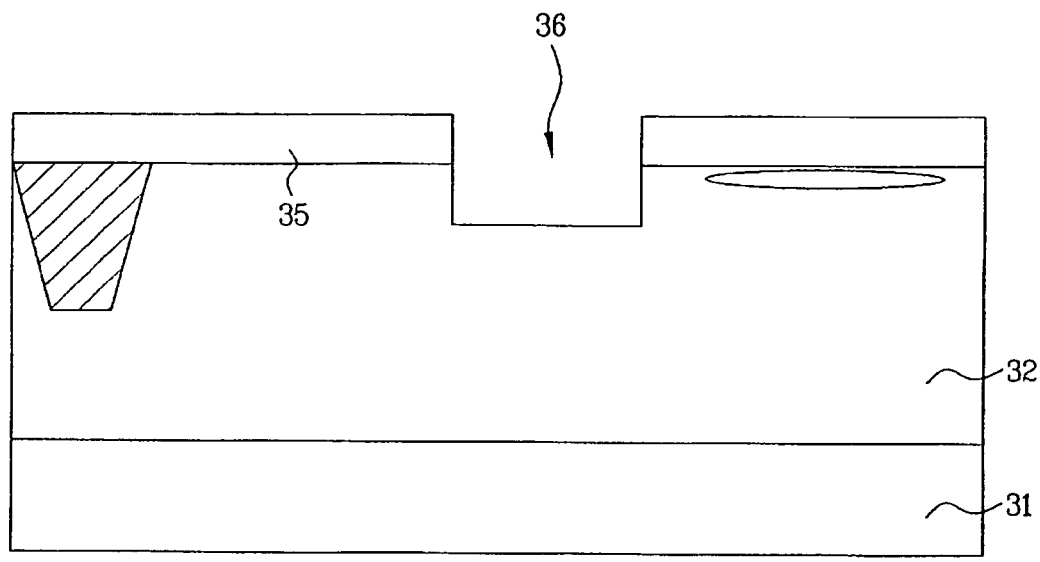

As shown in FIG. 4C, the first gate insulating film 35 on the transfer transistor area is selectively removed using a mask and an etching process. Then, the epitaxial layer 32 corresponding to a portion from which the first insulating film 35 is removed is etched at a predetermined depth to form a trench 36.

Figure 4D:
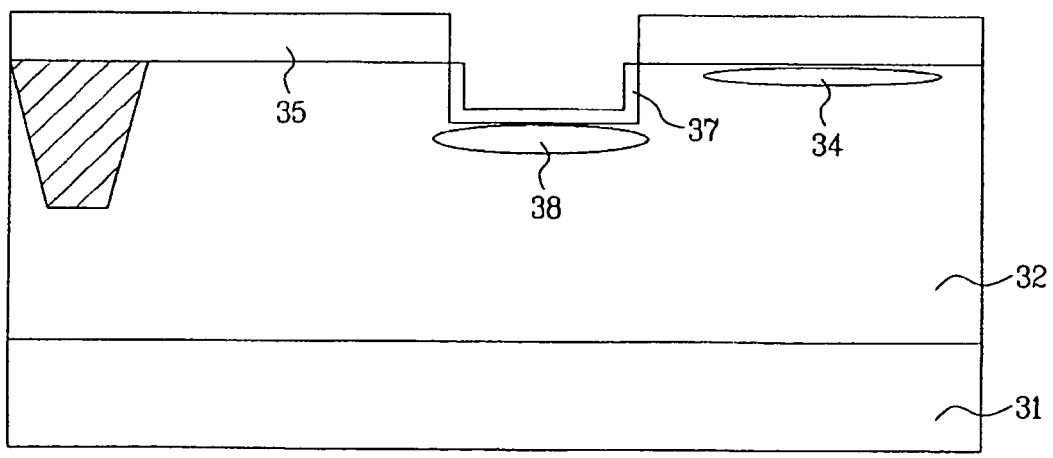

As shown in FIG. 4D, an impurity ion area 38 for controlling a threshold voltage of the transfer transistor is formed in the epitaxial layer 32 of the trench 36 using a mask and an impurity ion implantation process. An oxide film 37 can be formed inside the trench 36 to cover any damaged crystal lattice of the trench and protect the surface of the epitaxial layer 32 during impurity ion implantation for controlling the threshold voltage of the transfer transistor.

Figure 4E:
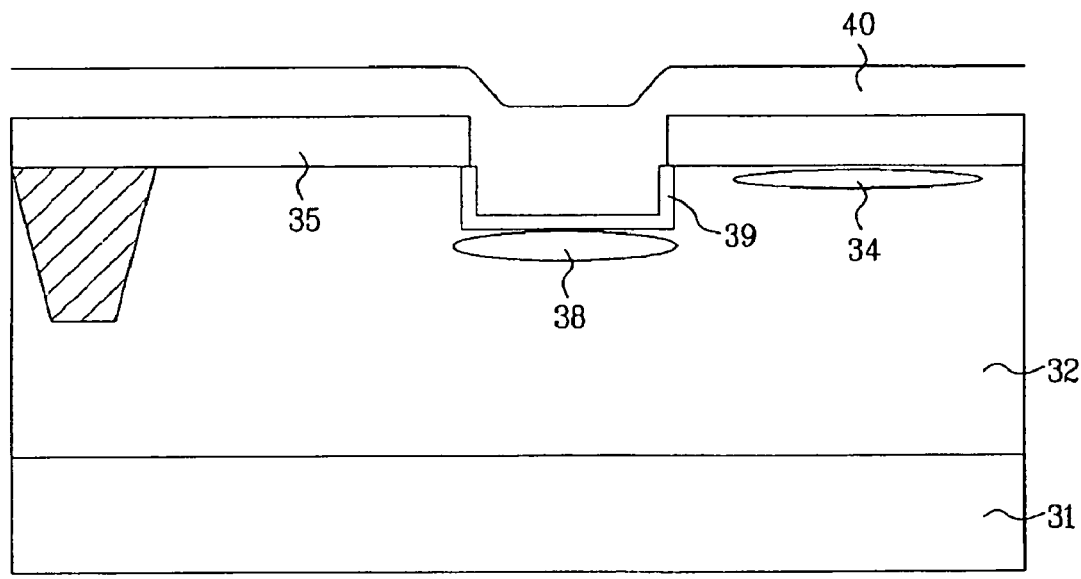

As shown in FIG. 4E, the oxide film 37 is removed, and a gate insulating film 39 is formed inside the trench 36. A conductive layer 40 of polysilicon is deposited on the entire surface of the substrate, so that the trench 38 is filled with the conductive layer 40.

Figure 4F:
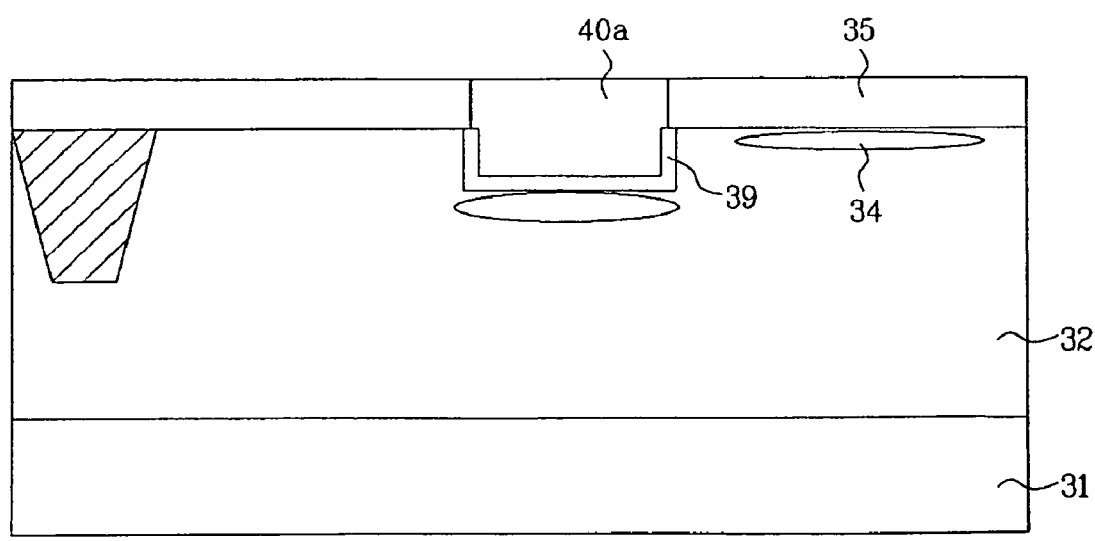

As shown in FIG. 4F, the conductive layer 40 is planarized by a CMP process to expose the surface of the first insulating film 35, so that a gate electrode 40a of the transfer transistor is formed in the trench 36.

Figure 4G:
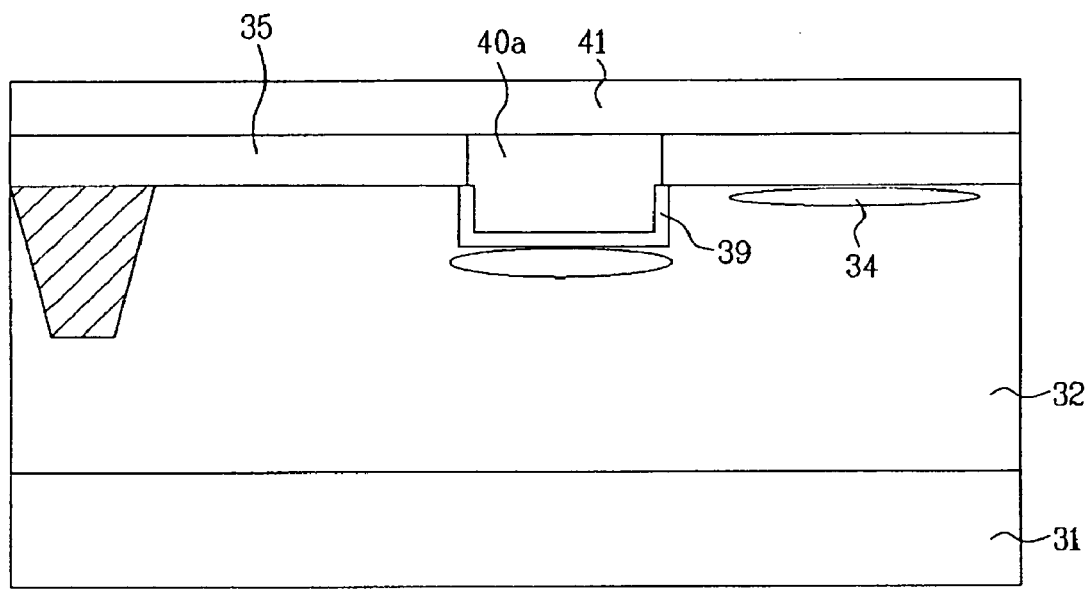

As shown in FIG. 4G, a second insulating film 41, such as oxide film or nitride film, is deposited on the entire surface of the first insulating film 35, including the gate electrode 40a.

Figure 4H:
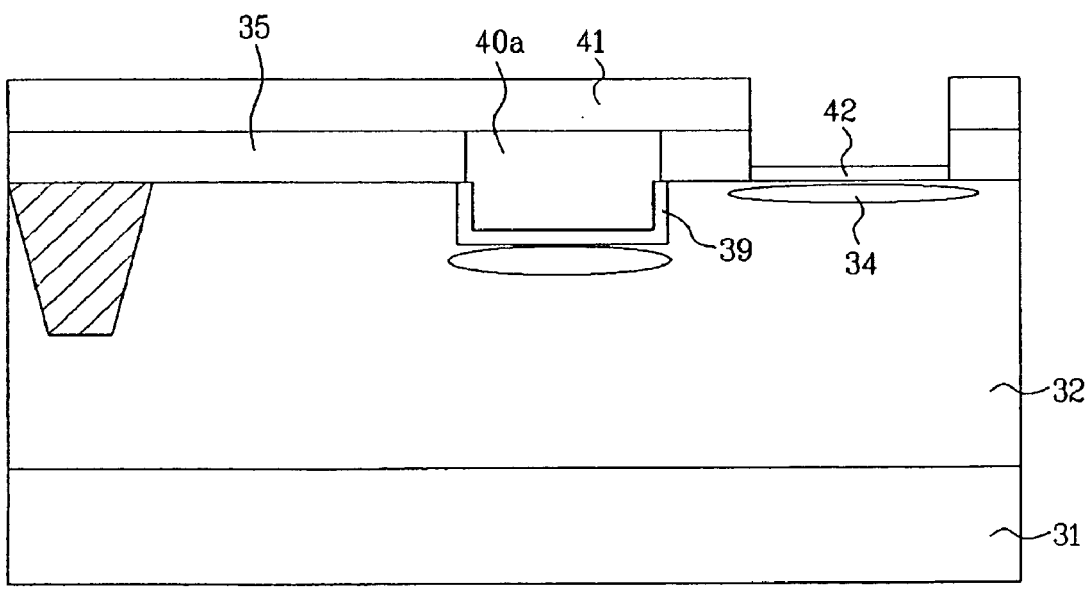

As shown in FIG. 4H, the first and second insulating films 35 and 41 corresponding to portions for gate electrodes of a reset transistor, a drive transistor and a selection transistor, excluding the transfer transistor, are selectively removed. The portion for the gate electrode of the reset transistor is shown in FIG. 4H.

Figure 4I:
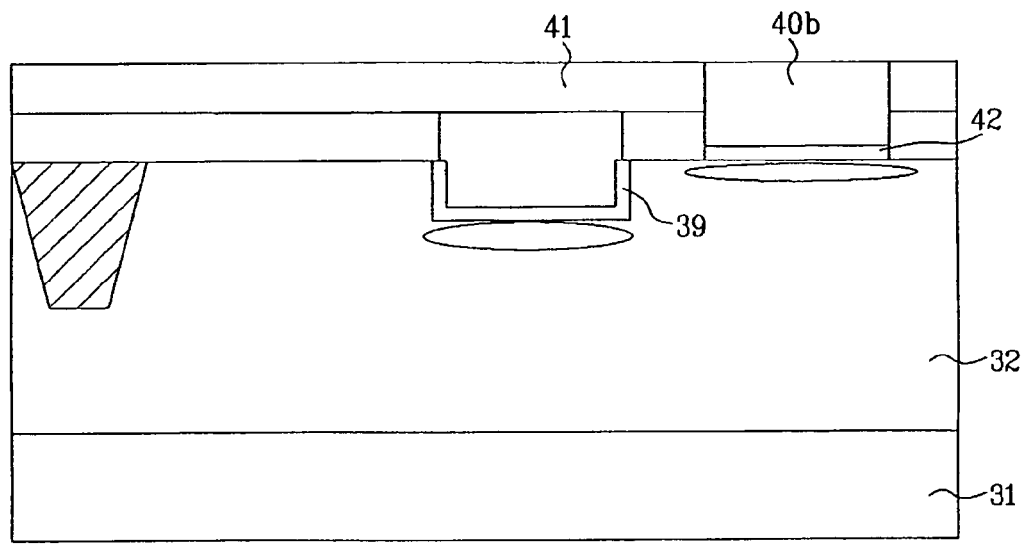

As shown in FIG. 4I, a gate insulating film 42 is formed on the surface of the epitaxial layer 32 in which the first and second insulating films 35 and 41 are removed. A conductive layer such as polysilicon is thickly deposited on an entire surface of the gate insulating film 42 and then is planarized by the CMP process to expose the surface of the gate insulating film 42, so that a gate electrode 40b of each transistor including the reset transistor is formed.

Figure 4J:
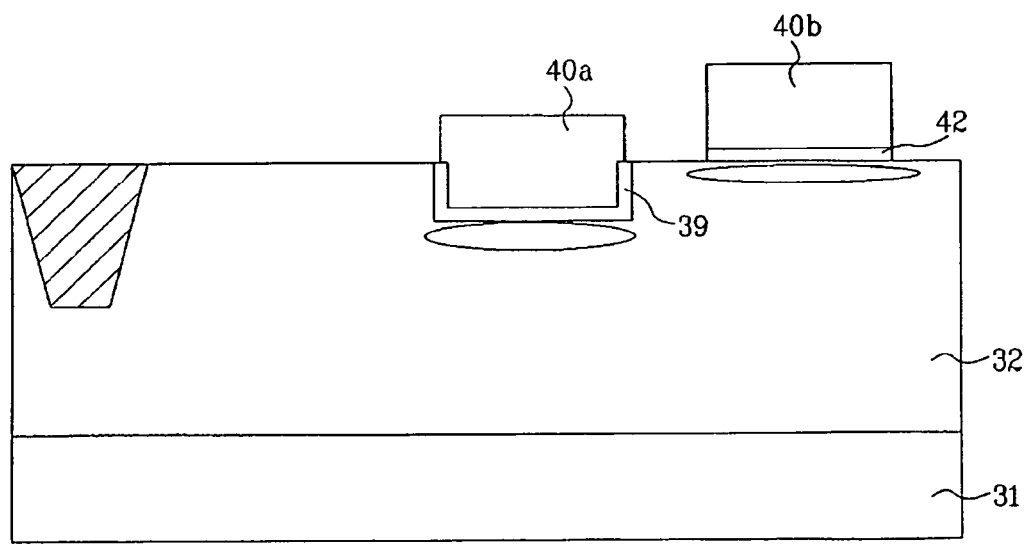

As shown in FIG. 4J, the first and second insulating films 35 and 41 are completely removed by a wet-etching process.

Figure 4K:
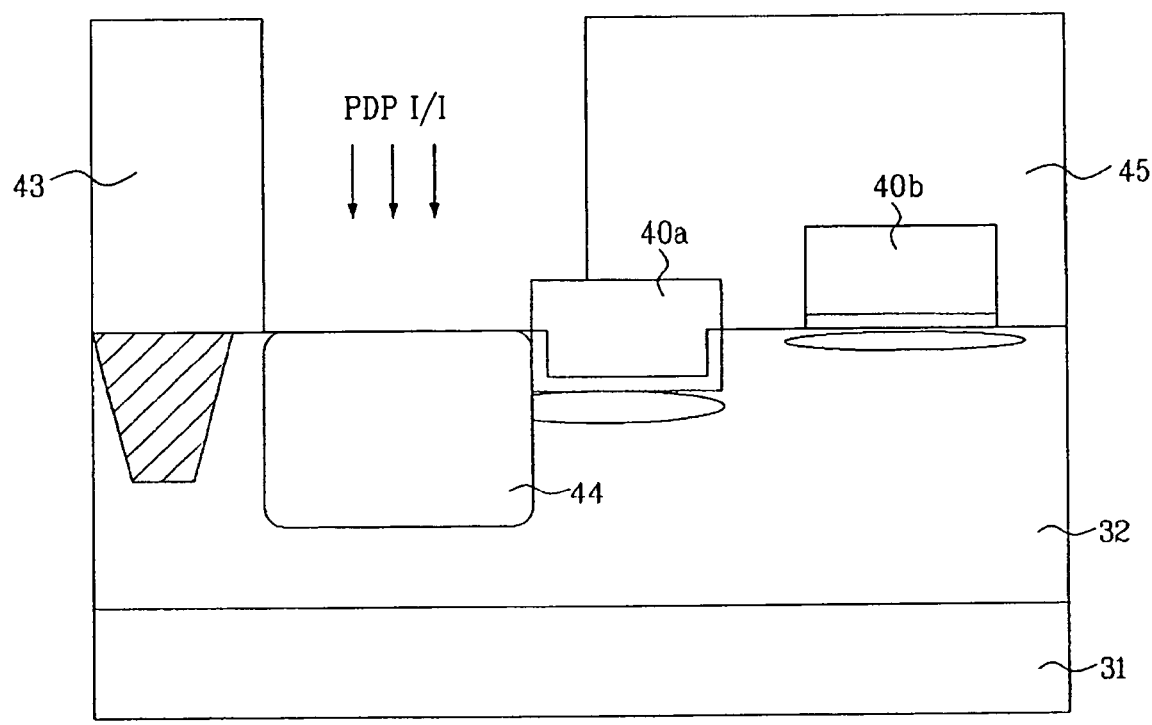

As shown in FIG. 4K, a photoresist film 43 is coated on the entire surface and then patterned by exposing and developing processes to expose the photodiode area. In other words, the photoresist pattern 43 is formed to partially cover the active area adjacent to the device isolation film 33 and partially expose the gate electrode 40a of the transfer transistor. Afterwards, N type impurity ions are implanted into the epitaxial layer 32 of the exposed photodiode area by high energy ion implantation to form an N type impurity ion area 44 in the photodiode area.

Figure 4L:
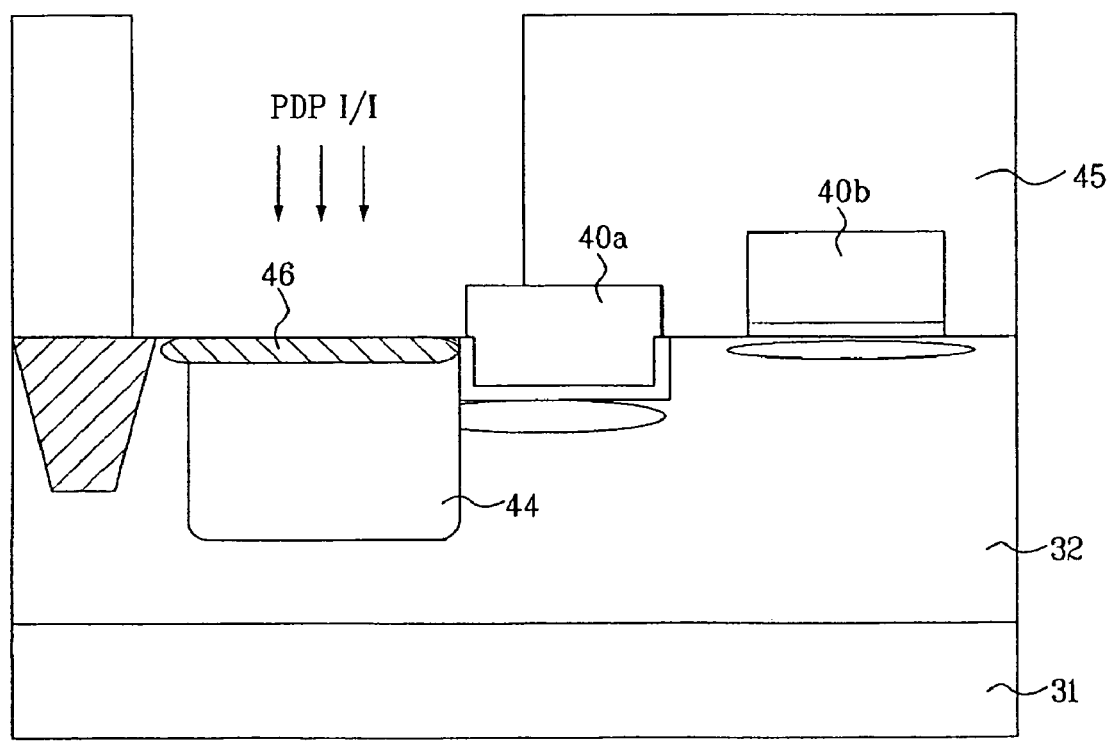

As shown in FIG. 4L, after the photoresist pattern 43 is removed, a photoresist film 45 is coated on the entire surface and then patterned by exposing and developing processes to expose the photodiode area. P type impurity ions are implanted into the surface of the N type impurity ion area 39 using the patterned photoresist film 45 as a mask to form a P type impurity ion area 46 of the photodiode area.

Figure 4M:
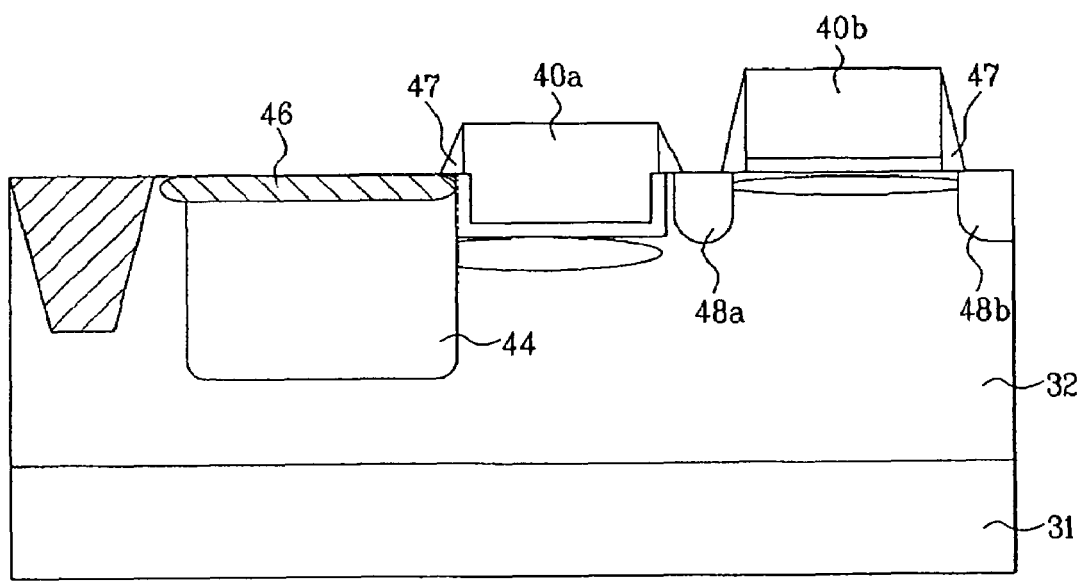

As shown in FIG. 4M, an insulating film is deposited on the entire surface and then removed by an anisotropic process to form spacers 47 at sidewalls of each of the gate electrodes 40a and 40b. Then, N type impurity ions are implanted into the active area between the gate electrodes 40a and 40b using the gate electrodes 40a and 40b and the spacers 47 as masks. Thus, a floating diffusion area and source and drain impurity ion areas 48a and 48b of each transistor are formed.

Afterwards, although not shown, color filter layers and microlenses are formed to complete the CMOS image sensor.

In the aforementioned CMOS image sensor fabricated as above in accordance with the present invention, the gate electrode of the transfer transistor is formed in the trench after the trench is formed in the surface of the epitaxial layer. Therefore, the P type impurity ion area is extended to the portion below the spacers of the gate electrode of the transfer transistor. In this case, it is possible to remove any dangling bonds existing in the surface of the epitaxial layer, thereby reducing the dark current.

Furthermore, since the P type impurity ion area of the photodiode area is higher than the channel area of the transfer transistor, a potential barrier in the source area of the transfer transistor is not increased. In this case, since transfer efficiency of the optical charges can be improved, it is possible to reduce a dead zone.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A CMOS image sensor comprising:
   a first conductive type semiconductor substrate having a photodiode area and a transistor area;
   a trench formed in the semiconductor substrate corresponding to a transfer transistor of the transistor area;
   a gate electrode of the transfer transistor formed in the trench;
   a plurality of gate electrodes formed on the semiconductor substrate of the transistor area, excluding the transistor area of the transfer transistor;
   source and drain impurity ion areas formed in the semiconductor substrate between the respective gate electrodes;
   an impurity ion implantation area for controlling a threshold voltage formed on the semiconductor substrate only below the gate electrode;
   a second conductive type impurity ion area formed in the semiconductor substrate of the photodiode area; and
   a first conductive type impurity ion area formed on a surface of the second conductive type impurity ion area,
   wherein a top surface of the gate electrode of the transistor including a reset transistor and excluding the transfer transistor is higher than a top surface of the gate electrode of the transfer transistor.

2. The CMOS image sensor as claimed in claim 1, further comprising spacers formed at sidewalls of each gate electrode.

3. The CMOS image sensor as claimed in claim 2, wherein the first conductive type impurity ion area is extended to a portion below the spacers.

4. A method for fabricating a CMOS image sensor comprising:
forming a first insulating film on an entire surface of a first conductive type semiconductor substrate having a photodiode area and a transistor area;
selectively removing the first insulating film on the transistor area for a transfer transistor;
forming a trench in the semiconductor substrate corresponding to a portion where the first insulating film is removed;
forming an impurity ion implantation area for controlling a threshold voltage of the transfer transistor only below the trench;
forming a gate insulating film and a gate electrode of the transfer transistor in the trench; and depositing a second insulating film on the entire surface of the semiconductor substrate and removing the first and second insulating films on the transistor area, excluding the transfer transistor; forming a plurality of gate insulating films and a plurality of gate electrodes on the semiconductor substrate where the first and second insulating films are removed and removing all of the first and second insulating films.

5. The method as claimed in claim 4, further comprising forming an oxide film inside the trench before forming the impurity ion implantation area for controlling the threshold voltage, and removing the oxide film before forming the gate insulating film.

6. The method as claimed in claim 4, further comprising forming an impurity ion implantation area for controlling a threshold voltage on the semiconductor substrate of the transistor area, excluding the transfer transistor, before forming the first insulating film.

7. The method as claimed in claim 4, further comprising forming spacers at sidewalls of each gate electrode.

8. The method as claimed in claim 4, further comprising forming a second conductive type impurity ion area in the semiconductor substrate of the photodiode area, forming a first conductive type impurity ion area on a surface of the second conductive type impurity ion area, and forming source and drain impurity ion areas in the semiconductor substrate between the respective gate electrodes.

* * * * *